(12) United States Patent
Funahashi et al.

(10) Patent No.: US 6,727,424 B2
(45) Date of Patent: Apr. 27, 2004

(54) COMPLEX OXIDE HAVING HIGH THERMOELECTRIC CONVERSION EFFICIENCY

(75) Inventors: Ryoji Funahashi, Ikeda (JP); Ichiro Matsubara, Ikeda (JP); Satoshi Sodeoka, Ikeda (JP)

(73) Assignee: Agency of Industrial Science and Technology, Tokyo-to (JP)

( * ) Notice: Subject to any disclaimer, the term of this patent is extended or adjusted under 35 U.S.C. 154(b) by 0 days.

(21) Appl. No.: 10/364,807

(22) Filed: Feb. 11, 2003

(65) Prior Publication Data

US 2003/0168641 A1 Sep. 11, 2003

Related U.S. Application Data

(62) Division of application No. 09/741,607, filed on Dec. 19, 2000, now Pat. No. 6,544,444.

(30) Foreign Application Priority Data

Jul. 18, 2000 (JP) ........................................ 2000-216819
Oct. 26, 2000 (JP) ........................................ 2000-326260

(51) Int. Cl.$^7$ ............................. H01L 35/00; H01L 1/08
(52) U.S. Cl. ............................. 136/236.1; 252/519.15; 252/519.3; 324/451
(58) Field of Search .................... 136/236.1; 324/451; 252/62.3 T, 519.13, 519.15, 521.1, 521.2

(56) References Cited

U.S. PATENT DOCUMENTS 6,376,763 B2    4/2002   Funahashi et al.

OTHER PUBLICATIONS

A. C. Masset, et al. "Misfit–layered cobaltite with an anisotropic giant magnetoresistance: $Ca_3Co_4O_9$". The American Physical Society, vol. 82, No. 1, 2000, 7, pp. 166–175.

Siwen Li, et al., "High temperature thermoelectric properties of oxide $CagCo_{12}O_{28}$", J. Mater. Chem., 1999, 9 pp. 1695–1660.

Eduard Woermann, et al., "Phase equilibria in the system CaO–Cobalt Oxide in air", J. inorg. nucl. Chem., 1970, vol. 32, pp. 1455–1459.

*Primary Examiner*—Mark Kopec
(74) *Attorney, Agent, or Firm*—Knobbe, Martens, Olson & Bear, LLP (57) ABSTRACT

This invention provides a complex oxide comprising the features of : (i) being represented by the formula: $(A_{0.4}B_{0.1}M_{0.1})_{x/0.6}Co_2O_y$ wherein A and B are elements differing from each other, each represents Ca, Sr or Ba, M represents Bi, Sc, Y, La, Ce, Pr, Nd, Sm, Eu, Gd, Tb, Dy, Ho, Er, Yb or Lu, $1.7 \leq x \leq 2$, and $3.8 \leq y \leq 5$, (ii) having a Seebeck coefficient of 100 $\mu$V/K or more at a temperature of 100 K (absolute temperature) or higher and (iii) having an electrical resistivity of 10 m$\Omega$cm or less at a temperature of 100 K (absolute temperature) or higher. The complex oxide of the invention is a material composed of low-toxicity elements existing in large amounts, the material having superior heat resistance and chemical durability and a high thermoelectric conversion efficiency in a temperature range of 600 K or higher which falls in the temperature range of waste heat.

7 Claims, 6 Drawing Sheets

FIG. 1

• Co
⊘ Ca, Sr, Ba, Bi, rare earth element
○ O

COMPLEX OXIDE HAVING HIGH THERMOELECTRIC CONVERSION EFFICIENCY

This is a divisional application of U.S. patent application Ser. No. 09/741,607, filed Dec. 19, 2000, now U.S. Pat. No. 6,544,444 which claims priority to Japanese Application No. 2000-216819, filed Jul. 18, 2000 and Japanese Application No. 2000-326260, filed Oct. 26, 2000.

FIELD OF THE INVENTION

The present invention relates to a complex oxide having an excellent thermoelectric conversion performance.

BACKGROUND ART

In our country, effective energy is obtained at a ratio of only about 30% from the primary supply energy, and about 70% of energy is eventually discarded as heat into the atmosphere. The heat evolved by combustion in plants, garbage-incinerating facilities or the like is thrown away into the atmosphere without conversion into other energy. In this way, we are uselessly casting away a vast amount of thermal energy and are acquiring only a small amount of energy by combustion of fossil fuel or otherwise.

To increase the proportion of acquired energy, the thermal energy to be released into the atmosphere should be effectively utilized. For this purpose, thermoelectric conversion for direct conversion of thermal energy to electrical energy is effective means. The thermoelectric conversion, which utilizes Seebeck effect, is an energy conversion method for generating electricity by creating a difference in temperature between both ends of a thermoelectric material to produce a difference of electric potential. In this thermoelectric generation, electricity is generated simply by setting one end of a thermoelectric material at a location heated to a high temperature by waste heat, and the other end thereof in the atmosphere (room temperature) and connecting a leading wire to both ends thereof. This method entirely eliminates a need for a device with moving parts such as a motor or a turbine required in the common generation of power. As a consequence, the method is economical and can be carried out without giving off a gas by combustion. Moreover, the method can continuously generate electricity until the thermoelectric material is deteriorated.

As set forth above, thermoelectric generation is a technique expected to play a share of role for the resolution of energy problems which will be concerned henceforth. To realize the thermoelectric generation, there is a need for developing thermoelectric materials which have a high thermoelectric conversion efficiency and have excellent heat resistance and chemical durability. Currently, intermetallic compounds are known as a substance of high thermoelectric conversion efficiency. Among them, $Bi_2Te_3$ has the highest thermoelectric conversion efficiency. However, the thermoelectric conversion efficiency of $Bi_2Te_3$ is only about 10% at highest. Further, $Bi_2Te_3$ can be used only at a temperature of 200° C. or lower. TeAgSb-containing metallic compound has a high thermoelectric conversion efficiency in a temperature range of about 600 to about 1,000 K which falls in the temperature range of waste heat. However, Te and Sb are rare elements having toxicity and can not be used in the air because they are readily oxidizable. With the above drawbacks, $Bi_2Te_3$ and TeAgSb-containing metallic compound are limited in application as a thermoelectric material for use.

In the foregoing situation, it is expected to develop materials composed of low-toxicity elements which exist in large amounts and which have superior heat resistance and chemical durability and a high thermoelectric conversion efficiency.

While metallic oxides may be proposed as materials excellent in heat resistance and chemical durability, the metallic oxides are lower in thermoelectric conversion efficiency by an order of magnitude than $Bi_2Te_3$. In fact, known oxides having a high electric conductivity (i.e., an electrical resistivity of about 10 mΩcm or less) show a Seebeck coefficient only as low as tens $\mu V/K$ or less.

DISCLOSURE OF THE INVENTION

A principal object of the present invention is to provide a material composed of low-toxicity elements existing in large amounts, the material having superior heat resistance and chemical durability and a high thermoelectric conversion efficiency in a temperature range of 600 K or higher which falls in the temperature range of waste heat.

The present inventor conducted extensive research in view of the above-mentioned current situation regarding thermoelectric materials and found that a complex oxide having a specific composition which includes two kinds of elements selected from Ca, Sr and Ba, an element selected from Bi and rare earth element, and Co and O as constituent elements has a high Seebeck coefficient and a high electric conductivity and is very useful as a thermoelectric material to be used for a thermoelectric module. The present invention was completed based on this novel finding.

The present invention provides the following complex oxide and P-type thermoelectric material.

1. A complex oxide comprising the features of:
    (i) being represented by the formula: $(A_{0.4}B_{0.1}M_{0.1})_{x/0.6}Co_2O_y$, wherein A and B are elements differing from each other, each represents Ca, Sr or Ba, M represents Bi, Sc, Y, La, Ce, Pr, Nd, Sm, Eu, Gd, Tb, Dy, Ho, Er, Yb or Lu, $1.7 \leq x \leq 2$, and $3.8 \leq y \leq 5$,
    (ii) having a Seebeck coefficient of 100 $\mu V/K$ or more at a temperature of 100 K (absolute temperature) or higher, and (iii) having an electrical resistivity of 10 mΩcm or less at a temperature of 100 K (absolute temperature) or higher.
2. The complex oxide as defined in item 1, wherein in the formula described in item 1, (1) A=Ca, B=Sr and M=Bi, (2) A=Ca, B=Sr and M=Gd, (3) A=Ba, B=Sr and M=Bi, or (4) A=Ba, B=Sr and M=Gd.
3. The complex oxide as defined in item 1 wherein the thermoelectric figure of merit is 1 or more at 600 K (absolute temperature) or higher.
4. A P-type thermoelectric material prepared from the complex oxide as defined in item 1.

The complex oxide of the present invention is represented by the formula: $(A_{0.4}B_{0.1}M_{0.1})_{x/0.6}Co_2O_y$. In the formula, A and B are different elements, each represents Ca, Sr or Ba, M represents Bi, Sc, Y, La, Ce, Pr, Nd, Sm, Eu, Gd, Tb, Dy, Ho, Er, Yb or Lu. The value of x ranges from 1.7 to 2, preferably 1.8 to 2 and the value of y ranges from 3.8 to 5, preferably 4 to 5.

Among the above-defined complex oxides, the following are preferred because of their high thermoelectric figure of merit (ZT): those wherein A=Ca, B=Sr and M=Bi, those wherein A=Ca, B=Sr and M=Gd, those wherein A=Ba, B=Sr and M=Bi and those wherein A=Ba, B=Sr and M=Gd.

The term "thermoelectric figure of merit (ZT)" used herein refers to a value given by calculation based on the following equation Thermoelectric figure of merit$(ZT) = S^2 T/\rho \kappa$ wherein S is a Seebeck coefficient, T is an absolute temperature, $\rho$ is an electrical resistivity and $\kappa$ is a thermal conductivity.

Figure 1:
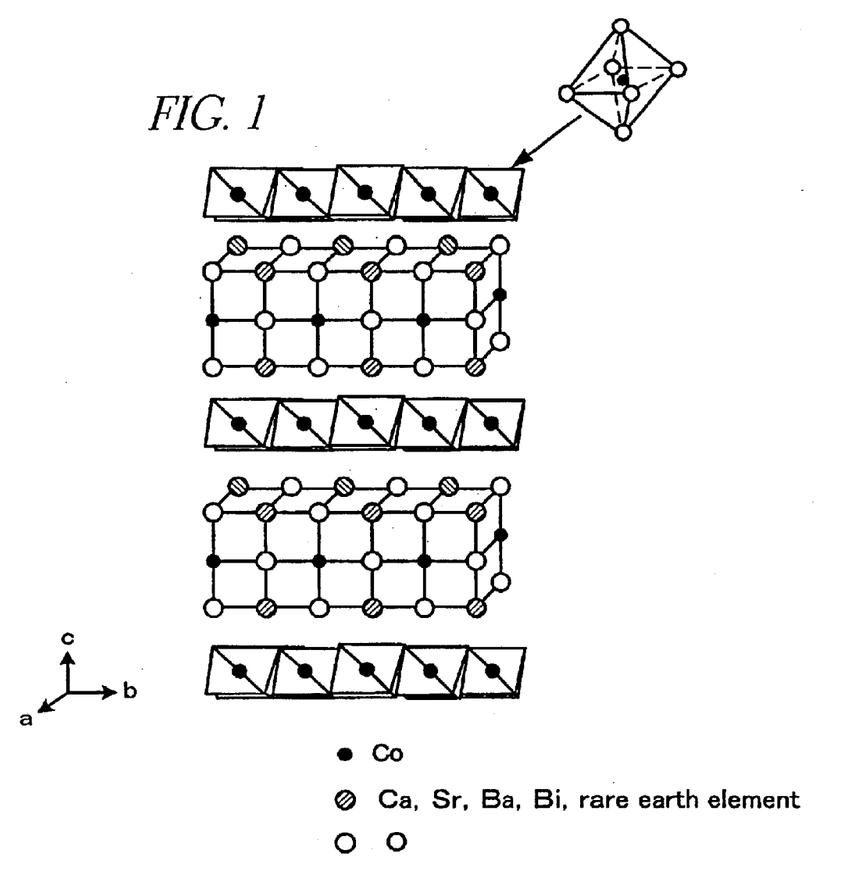
FIG. 1 shows a diagram schematically showing the crystalline structure of the complex oxide according to the invention.

The crystalline structure of the complex oxide according to the invention is schematically shown in FIG. 1. The complex oxide has a structure wherein two masses are alternately layered on each other. In this structure, one of two masses is a layer comprising series of Co-O unit cells which are combined side by side and extend lengthwise in the state of having an edge of the unit cell in common. The Co-O unit cell is formed so as to octahedrally coordinate 6 oxygen ions around one Co ion. The other mass is a layer comprising any of cations of A, B, M and Co arranged alternately with oxygen as an anion, i.e. a layer of the so-called rock salt type structure.

The complex oxide of the invention having the above-specified composition shows a Seebeck coefficient of 100 $\mu$V/K or more and an electrical resistivity of 10 mΩcm or less at a temperature of 100 K (absolute temperature) or higher. The complex oxide of the invention shows a tendency that as the temperature is elevated, the Seebeck coefficient is increased and the electrical resistivity is decreased. The complex oxide of the invention has both a high Seebeck coefficient and a low electrical resistivity so that the oxide can exhibit a high thermoelectric conversion performance when used as a thermoelectric material for a thermoelectric module. The complex oxide of the invention indicates a thermoelectric figure of merit of 1 or more (i.e. the level required for a thermoelectric material in practical use) at 600 K (absolute temperature) or higher, and is a thermoelectric material having excellent thermoelectric conversion performance.

Further, the complex oxide of the invention is composed of low-toxicity elements existing in a predominant amount, is superior in heat resistance and chemical durability and has outstanding utility as a thermoelectric material.

There is no limitation on processes for preparing the complex oxide of the invention insofar as the process can produce a complex oxide having the above-specified composition and a crystalline structure.

Employable conventional processes include, for example, single crystal-producing methods such as flux method, zone-melting method, picking-up method, glass annealing method via glass precursor and the like, powder-producing methods such as solid phase reaction method, sol gel method and the like, and film-forming methods such as sputtering method, laser-abrasion method, chemical vapor deposition method and the like which can produce a complex oxide having said composition and a crystalline structure.

Among these methods, the glass annealing method via glass precursor is described below in detail.

First, raw materials are melted and rapidly cooled for solidification. The melting conditions can be any insofar as they can melt uniformly the raw materials. When a crucible of alumina is used as a vessel for melting operation, it is desirable to heat the raw materials to about 1200 to about 1400° C. to prevent contamination with the vessel and to inhibit vaporization of raw materials. The heating time is not limited, and the heating is continued until a uniform melt is obtained. Usually the heating time is about 30 minutes to about 1 hour. The heating means are not limited, and can be any of desired means which include electric furnaces and gas furnaces. The melting can be conducted, for example, in an oxygen-containing atmosphere such as the air or an oxygen stream adjusted to a flow rate of about 300 ml/l or less. In the case of raw materials containing a sufficient amount of oxygen, the melting may be conducted in an inert atmosphere.

The rapid cooling conditions are not limited. The cooling may be conducted to the extent that at least the surface of the solidified product becomes a glassy amorphous layer. For example, the melt can be rapidly cooled by allowing the melt to flow over a metal plate and compressing the same using e.g., another metal plate. The cooling rate may be usually about 500° C./sec or higher, preferably $10^{3°}$ C./sec or higher.

Subsequently the product solidified by cooling is heat-treated in an oxygen-containing atmosphere, whereby fibrous single crystals of the complex oxide of the invention grow from the surface of the product.

The heat treatment temperature may be in the range of about 880 to about 930° C. The heat treatment can be conducted in an oxygen-containing atmosphere such as the air or an oxygen stream. When the heat treatment is effected in an oxygen stream, the stream may be adjusted to a flow rate of, for example, about 300 ml/min or less. The heat treatment time is not limited and can be determined according to the growth degree of the contemplated single crystal. Usually it is about 60 to about 1000 hours.

The mixing ratio of the raw materials can be determined depending on the chemical composition of the contemplated complex oxide. Stated more specifically, when fibrous single crystal of complex oxide is formed from the amorphous layer on the surface of the solidified product, the complex oxide has the same composition as that of solid phase which is in equilibrium with the amorphous layer, which is considered liquid phase, on the surface of the solidified product. Therefore, the mixing ratio of raw materials can be determined based on the relationship of chemical compositions between the solid phase (single crystal) and the liquid phase (amorphous layer) in equilibrium state.

The size of the single crystal of complex oxide thus obtained is variable with the kind of raw materials, composition ratio, heat treatment conditions and so on. The single crystal has, for example, a length of about 10 to about 1000 $\mu$m, a width of about 20 to about 200 $\mu$m and a thickness of about 1 to about 5 $\mu$m.

The process for preparing the complex oxide of the invention according to a solid phase reaction method is described below. The raw materials are mixed in the same proportions as the proportions of the metallic components of the contemplated complex oxide, and are sintered in the air or like oxygen-containing atmosphere at about 800 to about 900° C. for about 10 hours to give a calcined powder. Then, the calcined powder is press-molded and is sintered in an oxygen-containing atmosphere, thereby producing the desired complex oxide. Available as the oxygen-containing atmosphere are an ambient atmosphere and an oxygen stream having a flow rate of up to about 300 ml/min. The sintering means are not limited and can be any of desired means such as electric furnaces, gas furnaces, etc. The sintering temperature and the sintering time are not limited insofar as the desired complex oxide can be obtained. For example, the sintering is conducted at about 920 to about 1100° C. for about 20 to about 40 hours.

In any of the glass annealing method via glass precursor and the solid phase reaction method, the amount of oxygen contained in the obtained product can be controlled according to the flow rate of oxygen in sintering. The higher the flow rate of oxygen, the more the amount of oxygen in the product is. The variation in the amount of oxygen in the product does not seriously affect the electrical characteristics of the complex oxide. The raw materials are not limited insofar as they can produce the oxide when sintered. Useful raw materials include metals, oxides, compounds (such as carbonates) and the like. Examples of the Ca source as alkaline earth element are calcium oxide (CaO), calcium chloride ($CaCl_2$), calcium carbonate ($CaCO_3$), calcium nitrate ($Ca(NO_3)_2$), calcium hydroxide ($Ca(OH)_2$), alkoxides compounds such as dimethoxy calcium ($Ca(OCH_3)_2$), diethoxy calcium ($Ca(OC_2H_5)_2$)and dipropoxy calcium ($Ca(OC_3H_7)_2$), and the like. Examples of the source of Bi or rare earth element (hereinafter referred to as M) are oxides ($M_2O_3$ such as $Gd_2O_3$), nitrates ($M(NO_3)_3$), chlorides ($MCl_3$), hydroxides ($M(OH)_3$), alkoxide compounds ($M(OCH_3)_3$, $M(OC_2H_5)_3$ and $M(OC_3H_7)_3$), etc. Examples of the Co source are cobalt oxide (CoO, $Co_2O_3$ and $Co_3O_4$), cobalt chloride ($CoCl_2$), cobalt carbonate ($CoCO_3$), cobalt nitrate ($Co(NO_3)_2$), cobalt hydroxide ($Co(OH)_2$), alkoxide compounds such as dipropoxy cobalt ($Co(OC_3H_7)_2$) and the like, etc. Also usable as the raw material are compounds containing at least two elements constituting the complex oxide of the invention.

The complex oxide of the invention thus obtained has both a high Seebeck coefficient and a low electrical resistivity and is excellent in thermoelectric conversion performance so that the oxide can be effectively used as a thermoelectric material for a thermoelectric module.

Figure 2:
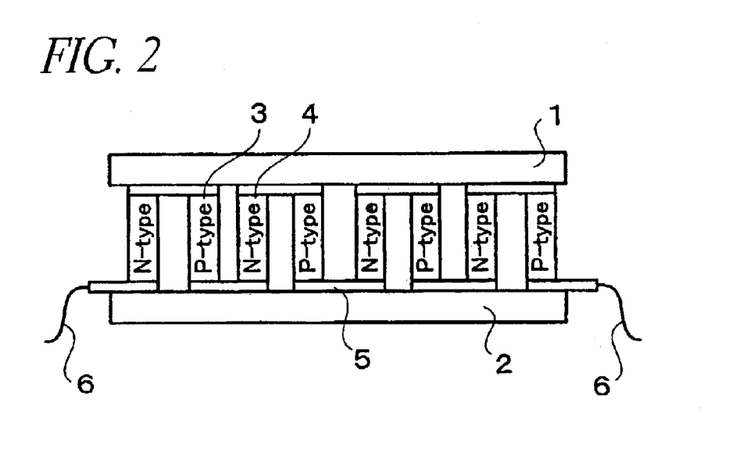
FIG. 2 schematically shows a thermoelectric module produced using the complex oxide of the invention as a thermoelectric material.

FIG. 2 schematically shows by way of example a thermoelectric module produced using the complex oxide of the invention as the thermoelectric material. Said thermoelectric module has the same structure as conventional thermoelectric module. The complex oxide of the invention can be used as a P-type thermoelectric material in a thermoelectric module which comprises a base plate for a high-temperature location 1, a base plate for a low-temperature location 2, a P-type thermoelectric material 3, an N-type thermoelectric material 4, an electrode 5 and a leading wire 6.

The complex oxide of the invention has a high Seebeck coefficient and a low electrical resistivity and is excellent in thermoelectric conversion performance and in heat resistance and chemical durability.

The complex oxide of the invention finds applications as a thermoelectric material usable at a high temperature in the air unlike conventional intermetallic compounds which can not be used under such conditions. Consequently it is expected that the thermal energy heretofore cast away into the atmosphere can be effectively used by incorporating the complex oxide of the invention into a thermoelectric generation system.

EXAMPLES

Examples are given below to further clarify the present invention in more detail.

Example 1

Figure 3:
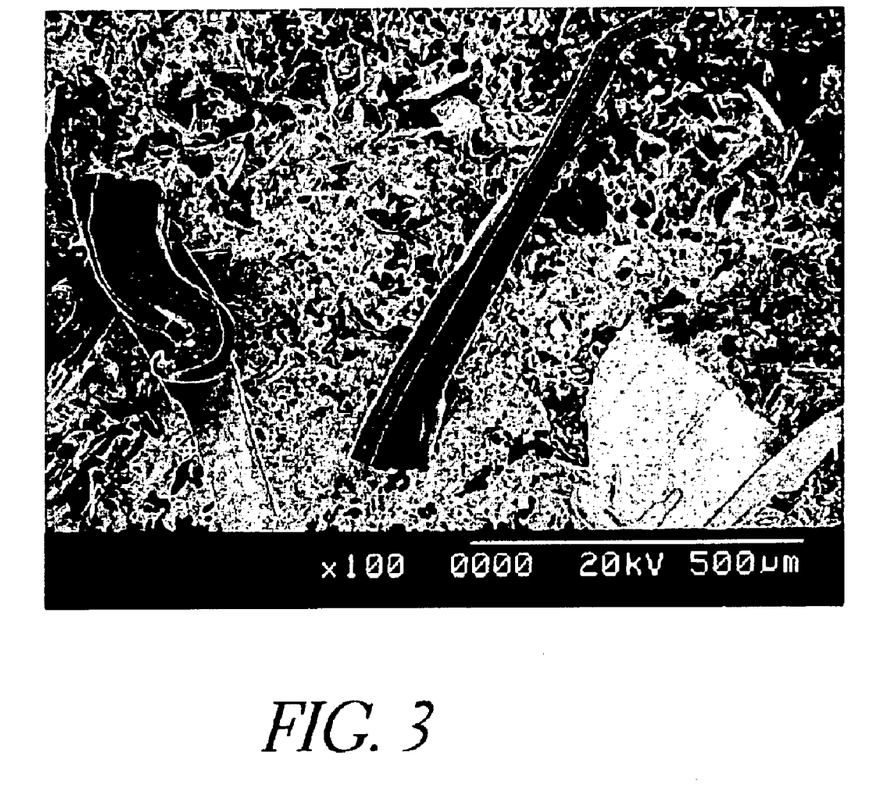
FIG. 3 is a scanning electron micrograph showing the crystalline structure of the complex oxide obtained in Example 1.

Using calcium carbonate ($CaCO_3$), strontium carbonate ($SrCO_3$), bismuth oxide ($Bi_2O_3$), and cobalt oxide ($CO_3O_4$) as the starting materials, thorough mixing was conducted at a mixing ratio (atom ratio) of 1:1:1:2 of Bi:Ca:Sr:Co. The mixture was charged into a crucible of alumina and was heated in the air using an electric furnace at a temperature of 1300° C. for 30 minutes to give a melt. The melt was allowed to flow over a copper plate, and was quenched by compression between the copper plate and another copper plate to give a glass precursor. The glass precursor was heat-treated in an oxygen stream (150 ml/min) at 930° C. for 1,000 hours to grow single crystals on the surface of the glass precursor. FIG. 3 shows a scanning electron micrograph of the obtained complex oxide. The single crystal of the complex oxide is one represented by the formula $(Ca_{0.4}Sr_{0.1}Bi_{0.1})_{1.7/0.6}CO_2O_{4.8}$.

Figure 4:
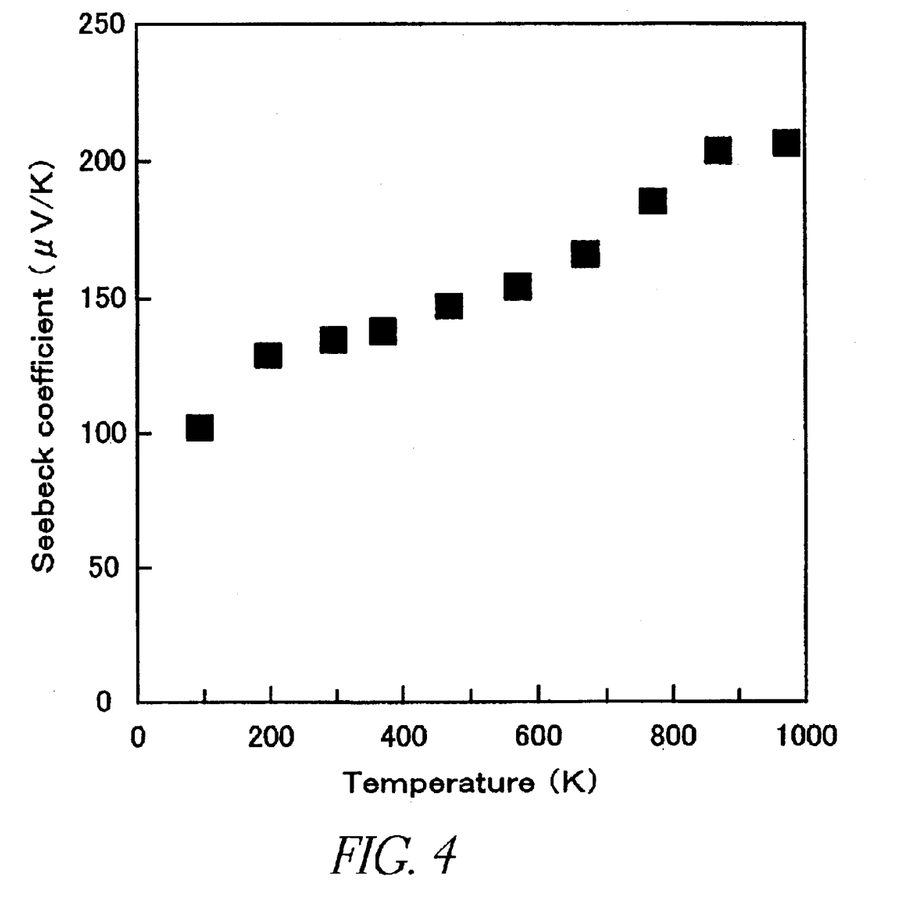
FIG. 4 is a graph showing the temperature dependency of Seebeck coefficient of the complex oxide prepared in Example 1.

FIG. 4 is a graph showing the temperature dependency of Seebeck coefficient (S) at 100 to 973 K (absolute temperature). It is apparent from FIG. 4 that the Seebeck coefficient of the complex oxide increased with the elevation of temperature. A similar temperature dependency was seen in all of Examples to be described later and the complex oxides showed a Seebeck coefficient of 100 $\mu$V/K or more at a temperature of 100 K or higher.

Figure 5:
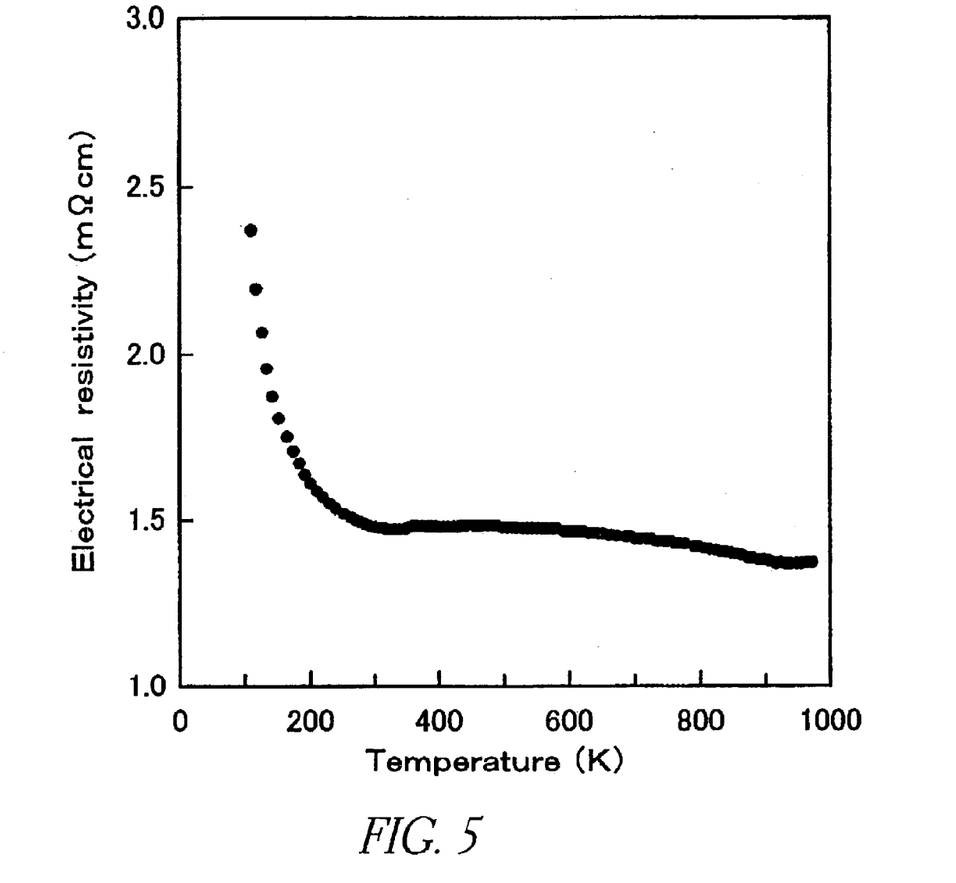
FIG. 5 is a graph showing the temperature dependency of electrical resistivity of the complex oxide prepared in Example 1.

FIG. 5 is a graph showing the temperature dependency of electrical resistivity ($\rho$) of the complex oxide at a temperature of 100 to 973 K (absolute temperature). It is seen from FIG. 5 that the electrical resistivity decreased with an increase in temperature, i.e., the complex oxide exhibited a semiconductor-like behavior and showed an electrical resistivity of about 10 m$\Omega$cm or below at 100 K or higher. In all of subsequent Examples, a similar temperature dependency of electrical resistivity ($\rho$) was found.

Figure 6:
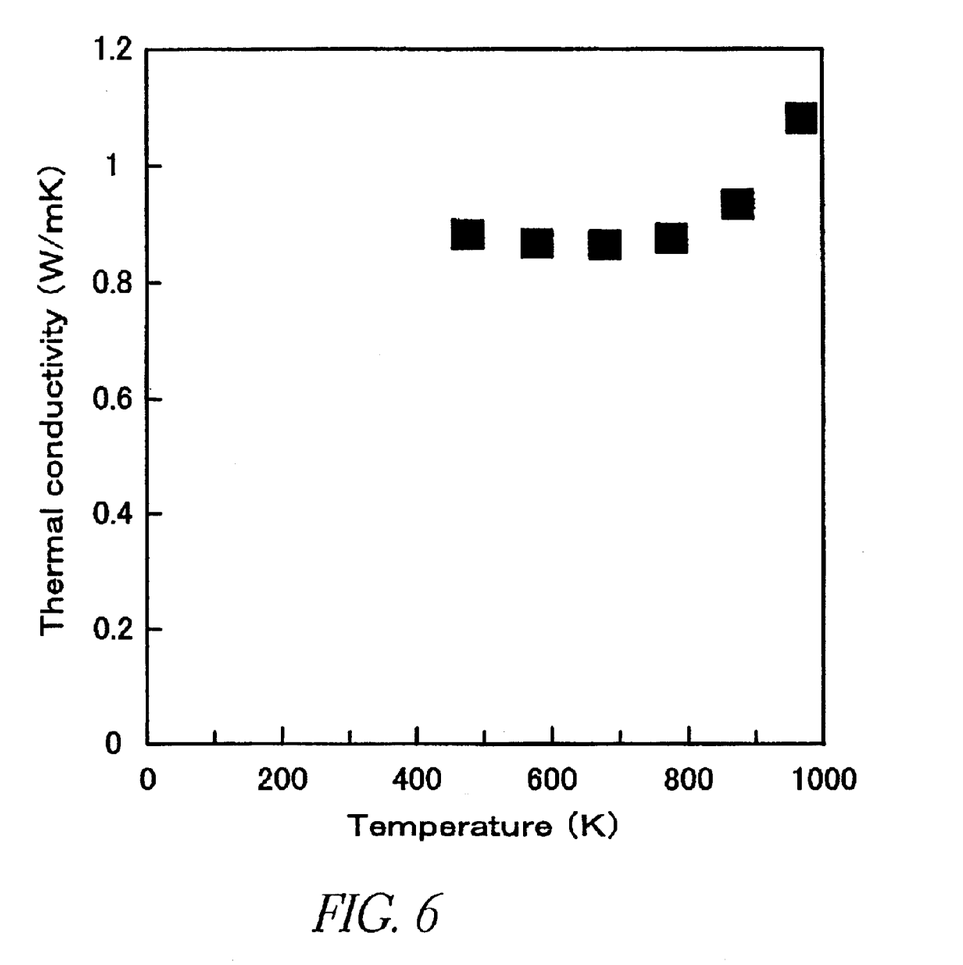
FIG. 6 is a graph showing the temperature dependency of thermal conductivity of the complex oxide prepared in Example 1.

FIG. 6 is a graph showing the temperature dependency of thermal conductivity ($\kappa$) of the complex oxide prepared in Example 1. The value ($\kappa$) was 1.1 W/mK at 973 K (absolute temperature) which means that the complex oxide had a lower thermal conductivity than common electroconductive oxides. This may be attributable to the layered structure of the complex oxide of the invention. It is presumable that the thermal conductivity was low because the thermal conductivity of lattice was reduced by phonon scattering in an interface between the layers.

Figure 7:
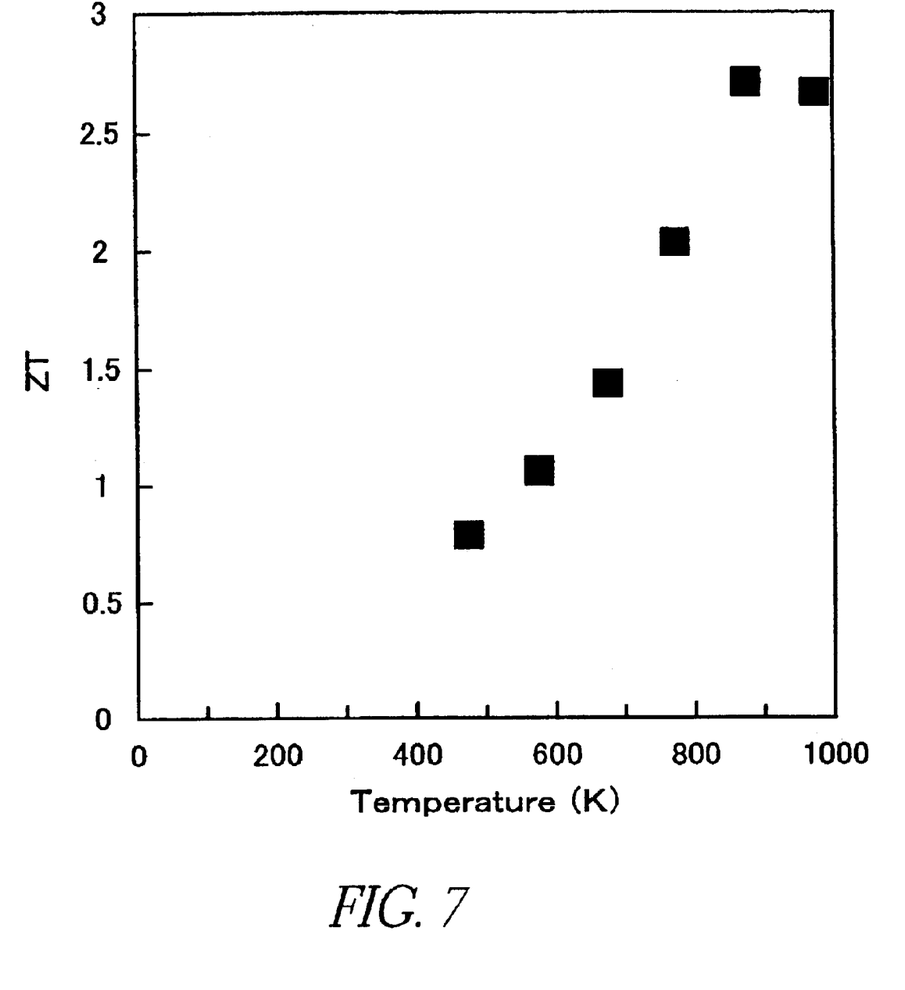
FIG. 7 is a graph showing the temperature dependency of thermoelectric figure of merit (ZT) of the complex oxide prepared in Example 1. In the drawings, indicated at 1 is a base plate for a high-temperature location; at 2, a base plate for a low-temperature location; at 3, a P-type thermoelectric material; at 4, an N-type thermoelectric material; at 5, an electrode; and at 6, a leading wire.

FIG. 7 is a graph showing the temperature dependency of thermoelectric figure of merit ZT of the complex oxide prepared in Example 1. The thermoelectric figure of merit (ZT) increased with the elevation of temperature. The complex oxide exhibited the thermoelectric figure of merit (ZT) of more than 1 (level required for use) at 600 K (absolute temperature) or higher and had a heretofore unattained high ZT value, i.e., ZT value of 2.7 at 873 to 973 K.

Examples 2–120

Complex oxides of the invention were produced in the same manner as in Example 1 with the exception of mixing the starting materials in the proportions shown under the column of "composition of raw materials for preparation of glass precursor" in Tables 1 to 6. The chemical formula of the obtained complex oxide is indicated above each table. The kind of M and the value of X in the formula are shown in each table.

Each table shows the Seebeck coefficient, electrical resistivity and thermoelectric figure of merit (ZT) shown by the obtained complex oxides.

The starting materials used in Examples 2–120 are as follows.
Ca source: calcium carbonate ($CaCO_3$)
Sr source: strontium carbonate ($SrCO_3$)
Ba source: barium carbonate ($BaCO_3$)
Rare earth element source: rare earth oxide ($RE_2O_3$)
Bi source: bismuth oxide ($Bi_2O_3$)
Co source: cobalt oxide ($Co_3O_4$)

TABLE 1

$(Ca_{0.4}Sr_{0.1}M_{0.1})_{x/0.6}Co_2O_{4-\delta}$

| Ex. | M | X | Comp. for Prep. of glass Precursor Bi:Ca:Sr:Co:M | Seebeck Coefficient 100 K $\mu V/K$ | Electrical resistivity 100 K $m\Omega cm$ | ZT 600 K |
|---|---|---|---|---|---|---|
| 1 | Bi | 1.7 | 1:1:1:2:0 | 110 | 2.0 | 1.2 |
| 2 | Bi | 2.0 | 1:1:1:2:0.5 | 130 | 2.2 | 1.4 |
| 3 | Y | 1.7 | 1:1:1:2:1 | 105 | 2.1 | 1.0 |
| 4 | Y | 2.0 | 1:1:1:2:1.5 | 118 | 2.4 | 1.4 |
| 5 | La | 1.7 | 1:1:1:2:1 | 107 | 2.0 | 1.2 |
| 6 | La | 2.0 | 1:1:1:2:1.5 | 118 | 2.3 | 1.8 |
| 7 | Gd | 1.7 | 1:1:1:2:1 | 115 | 2.1 | 1.3 |
| 8 | Gd | 2.0 | 1:1:1:2:1.5 | 140 | 2.5 | 1.5 |
| 9 | Sc | 1.7 | 1:1:1:2:1 | 102 | 2.3 | 1.0 |
| 10 | Ce | 1.7 | 1:1:1:2:1 | 104 | 2.2 | 1.1 |
| 11 | Pr | 1.7 | 1:1:1:2:1 | 105 | 2.5 | 1.0 |
| 12 | Nd | 1.7 | 1:1:1:2:1 | 110 | 2.4 | 1.2 |
| 13 | Sm | 1.7 | 1:1:1:2:1 | 111 | 2.3 | 1.4 |
| 14 | Eu | 1.7 | 1:1:1:2:1 | 106 | 2.5 | 1.2 |
| 15 | Tb | 1.7 | 1:1:1:2:1 | 100 | 2.4 | 1.0 |
| 16 | Dy | 1.7 | 1:1:1:2:1 | 102 | 2.2 | 1.2 |
| 17 | Ho | 1.7 | 1:1:1:2:1 | 107 | 2.3 | 1.1 |
| 18 | Er | 1.7 | 1:1:1:2:1 | 105 | 2.3 | 1.1 |
| 19 | Yb | 1.7 | 1:1:1:2:1 | 100 | 2.6 | 1.0 |
| 20 | Lu | 1.7 | 1:1:1:2:1 | 102 | 2.7 | 1.0 |

TABLE 2

$(Ca_{0.4}Ba_{0.1}M_{0.1})_{x/0.6}Co_2O_{4-\delta}$

| Ex. | M | X | Comp. for Prep. of glass Precursor Bi:Ca:Ba:Co:M | Seebeck coefficient 100 K $\mu V/K$ | Electrical resistivity 100 K $m\Omega cm$ | ZT 600 K |
|---|---|---|---|---|---|---|
| 21 | Bi | 1.7 | 1:1:1:2:0 | 105 | 2.0 | 1.1 |
| 22 | Bi | 2.0 | 1:1:1:2:0.5 | 130 | 2.1 | 1.2 |
| 23 | Y | 1.7 | 1:1:1:2:1 | 100 | 2.2 | 1.0 |
| 24 | Y | 2.0 | 1:1:1:2:1.5 | 110 | 2.3 | 1.2 |
| 25 | La | 1.7 | 1:1:1:2:1 | 105 | 2.0 | 1.0 |
| 26 | La | 2.0 | 1:1:1:2:1.5 | 110 | 2.5 | 1.6 |
| 27 | Gd | 1.7 | 1:1:1:2:1 | 115 | 2.1 | 1.3 |
| 28 | Gd | 2.0 | 1:1:1:2:1.5 | 130 | 2.4 | 1.2 |
| 29 | Sc | 1.7 | 1:1:1:2:1 | 102 | 2.3 | 1.0 |
| 30 | Ce | 1.7 | 1:1:1:2:1 | 100 | 2.2 | 1.0 |
| 31 | Pr | 1.7 | 1:1:1:2:1 | 105 | 2.5 | 1.0 |
| 32 | Nd | 1.7 | 1:1:1:2:1 | 110 | 2.4 | 1.2 |
| 33 | Sm | 1.7 | 1:1:1:2:1 | 110 | 2.7 | 1.4 |
| 34 | Eu | 1.7 | 1:1:1:2:1 | 105 | 2.6 | 1.0 |
| 35 | Tb | 1.7 | 1:1:1:2:1 | 100 | 2.5 | 1.0 |
| 36 | Dy | 1.7 | 1:1:1:2:1 | 101 | 2.5 | 1.2 |
| 37 | Ho | 1.7 | 1:1:1:2:1 | 107 | 2.3 | 1.1 |
| 38 | Er | 1.7 | 1:1:1:2:1 | 105 | 2.3 | 1.1 |

TABLE 2-continued $(Ca_{0.4}Ba_{0.1}M_{0.1})_{x/0.6}Co_2O_{4-\delta}$

| Ex. | M | X | Comp. for Prep. of glass Precursor Bi:Ca:Ba:Co:M | Seebeck coefficient 100 K $\mu V/K$ | Electrical resistivity 100 K $m\Omega cm$ | ZT 600 K |
|---|---|---|---|---|---|---|
| 39 | Yb | 1.7 | 1:1:1:2:1 | 100 | 2.6 | 1.0 |
| 40 | Lu | 1.7 | 1:1:1:2:1 | 110 | 2.9 | 1.0 |

TABLE 3

$(Sr_{0.4}Ca_{0.1}M_{0.1})_{x/0.6}Co_2O_{4-\delta}$

| Ex. | M | X | Comp. For Prep. Of glass Precursor Bi:Sr:Ca:Co:M | Seebeck coefficient 100 K $\mu V/K$ | Electrical resistivity 100 K $m\Omega cm$ | ZT 600 K |
|---|---|---|---|---|---|---|
| 41 | Bi | 1.7 | 1:1:1:2:0 | 120 | 2.4 | 1.2 |
| 42 | Bi | 2.0 | 1:1:1:2:0.5 | 135 | 2.5 | 1.4 |
| 43 | Y | 1.7 | 1:1:1:2:1 | 110 | 2.7 | 1.3 |
| 44 | Y | 2.0 | 1:1:1:2:1.5 | 120 | 2.3 | 1.3 |
| 45 | La | 1.7 | 1:1:1:2:1 | 115 | 2.2 | 1.2 |
| 46 | La | 2.0 | 1:1:1:2:1.5 | 118 | 2.3 | 1.8 |
| 47 | Gd | 1.7 | 1:1:1:2:1 | 118 | 2.2 | 1.3 |
| 48 | Gd | 2.0 | 1:1:1:2:1.5 | 130 | 2.6 | 1.5 |
| 49 | Sc | 1.7 | 1:1:1:2:1 | 112 | 2.5 | 1.1 |
| 50 | Ce | 1.7 | 1:1:1:2:1 | 115 | 2.8 | 1.0 |
| 51 | Pr | 1.7 | 1:1:1:2:1 | 118 | 2.3 | 1.1 |
| 52 | Nd | 1.7 | 1:1:1:2:1 | 110 | 2.4 | 1.2 |
| 53 | Sm | 1.7 | 1:1:1:2:1 | 117 | 2.4 | 1.3 |
| 54 | Eu | 1.7 | 1:1:1:2:1 | 108 | 2.5 | 1.3 |
| 55 | Tb | 1.7 | 1:1:1:2:1 | 103 | 2.6 | 1.1 |
| 56 | Dy | 1.7 | 1:1:1:2:1 | 102 | 2.3 | 1.0 |
| 57 | Ho | 1.7 | 1:1:1:2:1 | 108 | 2.4 | 1.1 |
| 58 | Er | 1.7 | 1:1:1:2:1 | 110 | 2.4 | 1.2 |
| 59 | Yb | 1.7 | 1:1:1:2:1 | 103 | 2.7 | 1.0 |
| 60 | Lu | 1.7 | 1:1:1:2:1 | 104 | 2.9 | 1.1 |

TABLE 4

$(Sr_{0.4}Ba_{0.1}M_{0.1})_{x/0.6}Co_2O_{4-\delta}$

| Ex. | M | X | Comp. For Prep. Of glass Precursor Bi:Sr:Ba:Co:M | Seebeck coefficient 100 K $\mu V/K$ | Electrical resistivity 100 K $m\Omega cm$ | ZT 600 K |
|---|---|---|---|---|---|---|
| 61 | Bi | 1.7 | 1:1:1:2:0 | 105 | 1.8 | 1.2 |
| 62 | Bi | 2.0 | 1:1:1:2:0.5 | 121 | 2.0 | 1.3 |
| 63 | Y | 1.7 | 1:1:1:2:1 | 102 | 2.0 | 1.1 |
| 64 | Y | 2.0 | 1:1:1:2:1.5 | 110 | 2.2 | 1.2 |
| 65 | La | 1.7 | 1:1:1:2:1 | 107 | 1.8 | 1.3 |
| 66 | La | 2.0 | 1:1:1:2:1.5 | 112 | 1.9 | 1.7 |
| 67 | Gd | 1.7 | 1:1:1:2:1 | 113 | 1.8 | 1.2 |
| 68 | Gd | 2.0 | 1:1:1:2:1.5 | 130 | 2.2 | 1.1 |
| 69 | Sc | 1.7 | 1:1:1:2:1 | 100 | 2.3 | 1.0 |
| 70 | Ce | 1.7 | 1:1:1:2:1 | 103 | 2.1 | 1.1 |
| 71 | Pr | 1.7 | 1:1:1:2:1 | 105 | 2.5 | 1.0 |
| 72 | Nd | 1.7 | 1:1:1:2:1 | 110 | 2.4 | 1.2 |
| 73 | Sm | 1.7 | 1:1:1:2:1 | 110 | 2.2 | 1.3 |
| 74 | Eu | 1.7 | 1:1:1:2:1 | 106 | 2.4 | 1.4 |
| 75 | Tb | 1.7 | 1:1:1:2:1 | 100 | 2.4 | 1.0 |
| 76 | Dy | 1.7 | 1:1:1:2:1 | 105 | 2.3 | 1.3 |
| 77 | Ho | 1.7 | 1:1:1:2:1 | 108 | 2.1 | 1.2 |
| 78 | Er | 1.7 | 1:1:1:2:1 | 105 | 2.3 | 1.1 |
| 79 | Yb | 1.7 | 1:1:1:2:1 | 100 | 2.5 | 1.1 |
| 80 | Lu | 1.7 | 1:1:1:2:1 | 100 | 2.4 | 1.0 |

TABLE 5

$(Ba_{0.4}Ca_{0.1}M_{0.1})_{x/0.6}Co_2O_{4-\delta}$

| Ex. | M | X | Comp. For Prep. of glass Precursor Bi:Ba:Ca:Co:M | Seebeck coefficient 100 K $\mu V/K$ | Electrical resistivity 100 K m$\Omega$cm | ZT 600 K |
|---|---|---|---|---|---|---|
| 81 | Bi | 1.7 | 1:1:1:2:0 | 110 | 2.0 | 1.2 |
| 82 | Bi | 2.0 | 1:1:1:2:0.5 | 130 | 2.2 | 1.4 |
| 83 | Y | 1.7 | 1:1:1:2:1 | 105 | 2.1 | 1.0 |
| 84 | Y | 2.0 | 1:1:1:2:1.5 | 117 | 2.3 | 1.5 |
| 85 | La | 1.7 | 1:1:1:2:1 | 107 | 2.0 | 1.2 |
| 86 | La | 2.0 | 1:1:1:2:1.5 | 118 | 2.3 | 1.8 |
| 87 | Gd | 1.7 | 1:1:1:2:1 | 111 | 2.0 | 1.3 |
| 88 | Gd | 2.0 | 1:1:1:2:1.5 | 120 | 2.7 | 1.4 |
| 89 | Sc | 1.7 | 1:1:1:2:1 | 108 | 2.7 | 1.1 |
| 90 | Ce | 1.7 | 1:1:1:2:1 | 104 | 2.2 | 1.1 |
| 91 | Pr | 1.7 | 1:1:1:2:1 | 105 | 2.5 | 1.0 |
| 92 | Nd | 1.7 | 1:1:1:2:1 | 110 | 2.4 | 1.2 |
| 93 | Sm | 1.7 | 1:1:1:2:1 | 111 | 2.7 | 1.2 |
| 94 | Eu | 1.7 | 1:1:1:2:1 | 106 | 2.5 | 1.2 |
| 95 | Tb | 1.7 | 1:1:1:2:1 | 100 | 2.4 | 1.0 |
| 96 | Dy | 1.7 | 1:1:1:2:1 | 105 | 2.5 | 1.1 |
| 97 | Ho | 1.7 | 1:1:1:2:1 | 108 | 2.2 | 1.1 |
| 98 | Er | 1.7 | 1:1:1:2:1 | 102 | 2.4 | 1.1 |
| 99 | Yb | 1.7 | 1:1:1:2:1 | 100 | 2.5 | 1.2 |
| 100 | Lu | 1.7 | 1:1:1:2:1 | 101 | 2.3 | 1.0 |

TABLE 6

$(Ba_{0.4}Sr_{0.1}M_{0.1})_{x/0.6}Co_2O_{4-\delta}$

| Ex. | M | X | Comp. For Prep. Of glass Precursor Bi:Ba:Sr:Co:M | Seebeck Coefficient 100 K $\mu V/K$ | Electrical resistivity 100 K m$\Omega$cm | ZT 600 K |
|---|---|---|---|---|---|---|
| 101 | Bi | 1.7 | 1:1:1:2:0 | 120 | 2.1 | 1.1 |
| 102 | Bi | 2.0 | 1:1:1:2:0.5 | 140 | 2.2 | 1.3 |
| 103 | Y | 1.7 | 1:1:1:2:1 | 118 | 2.3 | 1.2 |
| 104 | Y | 2.0 | 1:1:1:2:1.5 | 119 | 2.4 | 1.6 |
| 105 | La | 1.7 | 1:1:1:2:1 | 120 | 2.2 | 1.3 |
| 106 | La | 2.0 | 1:1:1:2:1.5 | 118 | 2.2 | 1.9 |
| 107 | Gd | 1.7 | 1:1:1:2:1 | 117 | 2.0 | 1.5 |
| 108 | Gd | 2.0 | 1:1:1:2:1.5 | 152 | 2.6 | 1.8 |
| 109 | Sc | 1.7 | 1:1:1:2:1 | 121 | 2.5 | 1.1 |
| 110 | Ce | 1.7 | 1:1:1:2:1 | 125 | 2.4 | 1.2 |
| 111 | Pr | 1.7 | 1:1:1:2:1 | 110 | 2.7 | 1.1 |
| 112 | Nd | 1.7 | 1:1:1:2:1 | 121 | 2.7 | 1.3 |
| 113 | Sm | 1.7 | 1:1:1:2:1 | 123 | 2.4 | 1.6 |
| 114 | Eu | 1.7 | 1:1:1:2:1 | 107 | 2.5 | 1.2 |
| 115 | Tb | 1.7 | 1:1:1:2:1 | 110 | 2.6 | 1.2 |
| 116 | Dy | 1.7 | 1:1:1:2:1 | 108 | 2.2 | 1.1 |
| 117 | Ho | 1.7 | 1:1:1:2:1 | 113 | 2.1 | 1.0 |
| 118 | Er | 1.7 | 1:1:1:2:1 | 109 | 2.2 | 1.2 |
| 119 | Yb | 1.7 | 1:1:1:2:1 | 110 | 2.5 | 1.1 |
| 120 | Lu | 1.7 | 1:1:1:2:1 | 107 | 2.7 | 1.1 |

Example 121

Using calcium carbonate ($CaCO_3$), strontium carbonate ($SrCO_3$), bismuth oxide ($Bi_2O_3$), and cobalt oxide ($Co_3O_4$) as the starting materials, thorough mixing was conducted at a mixing ratio (atom ratio) of 1.2:0.3:0.3:2.0 of Ca:Sr:Bi:Co. The mixture was charged into a crucible of alumina and was calcined in the air using an electric furnace at a temperature of 800° C. for 10 hours. The calcined product was crushed and molded, and the molded body was sintered in an oxygen stream (150 ml/min) at 850° C. for 60 hours, whereby a complex oxide represented by the formula: $(Ca_{0.4}Sr_{0.1}Bi_{0.1})_{1.8/0.6}Co_2O_{4.95}$ was obtained. The obtained complex oxide showed a Seebeck coefficient of 110 $\mu V/K$ at a temperature of 100 K and an electrical resistivity of about 6.0 m$\Omega$cm at 100 K, and had a thermoelectric figure of merit (ZT) of 1.2 at 600 K, and thus a high thermoelectric conversion efficiency.

Examples 122 to 240

Complex oxides of the invention were produced in the same manner as in Example 121 with the exception of mixing the starting materials in the same proportions as those of metallic components for the contemplated complex oxide. The chemical formula of the obtained complex oxides is indicated above each table. The kind of M and the value of X in the formula are shown in each table.

Tables 7–12 show the measured results of Seebeck coefficient, electrical resistivity and thermoelectric figure of merit (ZT) shown by the obtained complex oxides.

The starting materials used in Examples 122–240 are as follows.

Ca source: calcium carbonate ($CaCO_3$)
Sr source: strontium carbonate ($SrCO_3$)
Ba source: barium carbonate ($BaCO_3$)
Rare earth element source: rare earth oxide ($RE_2O_3$)
Bi source: bismuth oxide ($Bi_2O_3$)
Co source: cobalt oxide ($Co_3O_4$)

TABLE 7

$(Ca_{0.4}Sr_{0.1}M_{0.1})_{x/0.6}Co_2O_{4-\delta}$

| Ex. | M | X | Seebeck Coefficient 100 K $\mu V/K$ | Electrical resistivity 100 K m$\Omega$cm | ZT 600 K |
|---|---|---|---|---|---|
| 121 | Bi | 1.8 | 110 | 6.0 | 1.2 |
| 122 | Bi | 2.0 | 130 | 6.6 | 1.4 |
| 123 | Y | 1.8 | 105 | 6.3 | 1.0 |
| 124 | Y | 2.0 | 118 | 6.8 | 1.4 |
| 125 | La | 1.8 | 107 | 6.0 | 1.2 |
| 126 | La | 2.0 | 118 | 6.9 | 1.3 |
| 127 | Gd | 1.8 | 115 | 6.3 | 1.3 |
| 128 | Gd | 2.0 | 140 | 7.0 | 1.5 |
| 129 | Sc | 2.0 | 102 | 6.8 | 1.0 |
| 130 | Ce | 2.0 | 104 | 6.6 | 1.1 |
| 131 | Pr | 2.0 | 105 | 7.2 | 1.0 |
| 132 | Nd | 2.0 | 110 | 6.8 | 1.2 |
| 133 | Sm | 2.0 | 111 | 6.9 | 1.4 |
| 134 | Eu | 2.0 | 106 | 7.1 | 1.2 |
| 135 | Tb | 2.0 | 100 | 7.2 | 1.0 |
| 136 | Dy | 2.0 | 102 | 6.6 | 1.2 |
| 137 | Ho | 2.0 | 107 | 6.9 | 1.1 |
| 138 | Er | 2.0 | 105 | 6.9 | 1.1 |
| 139 | Yb | 2.0 | 100 | 7.6 | 1.0 |
| 140 | Lu | 2.0 | 102 | 6.3 | 1.0 |

TABLE 8

$(Ca_{0.4}Ba_{0.1}M_{0.1})_{x/0.6}Co_2O_{4-\delta}$

| Ex. | M | X | Seebeck Coefficient 100 K $\mu V/K$ | Electrical resistivity 100 K m$\Omega$cm | ZT 600 K |
|---|---|---|---|---|---|
| 141 | Bi | 1.8 | 114 | 6.2 | 1.3 |
| 142 | Bi | 2.0 | 130 | 6.6 | 1.4 |
| 143 | Y | 1.8 | 119 | 6.5 | 1.4 |
| 144 | Y | 2.0 | 115 | 6.8 | 1.2 |
| 145 | La | 1.8 | 107 | 5.8 | 1.2 |
| 146 | La | 2.0 | 118 | 6.9 | 1.2 |
| 147 | Gd | 1.8 | 117 | 6.3 | 1.2 |
| 148 | Gd | 2.0 | 140 | 6.8 | 1.5 |
| 149 | Sc | 2.0 | 100 | 6.8 | 1.0 |

TABLE 8-continued $(Ca_{0.4}Ba_{0.1}M_{0.1})_{x/0.6}Co_2O_{4-\delta}$

| Ex. | M | X | Seebeck Coefficient 100 K μV/K | Electrical resistivity 100 K mΩcm | ZT 600 K |
|---|---|---|---|---|---|
| 150 | Ce | 2.0 | 104 | 6.6 | 1.1 |
| 151 | Pr | 2.0 | 110 | 7.2 | 1.1 |
| 152 | Nd | 2.0 | 112 | 7.0 | 1.2 |
| 153 | Sm | 2.0 | 111 | 6.9 | 1.4 |
| 154 | Eu | 2.0 | 106 | 7.1 | 1.2 |
| 155 | Tb | 2.0 | 100 | 7.2 | 1.0 |
| 156 | Dy | 2.0 | 105 | 6.6 | 1.2 |
| 157 | Ho | 2.0 | 110 | 7.2 | 1.0 |
| 158 | Er | 2.0 | 101 | 6.5 | 1.1 |
| 159 | Yb | 2.0 | 100 | 7.6 | 1.0 |
| 160 | Lu | 2.0 | 102 | 6.3 | 1.0 |

TABLE 9

$(Sr_{0.4}Ca_{0.1}M_{0.1})_{x/0.6}Co_2O_{4-\delta}$

| Ex. | M | X | Seebeck Coefficient 100 K μV/K | Electrical resistivity 100 K mΩcm | ZT 600 K |
|---|---|---|---|---|---|
| 161 | Bi | 1.8 | 110 | 6.0 | 1.2 |
| 162 | Bi | 2.0 | 120 | 6.2 | 1.2 |
| 163 | Y | 1.8 | 111 | 6.4 | 1.1 |
| 164 | Y | 2.0 | 112 | 6.8 | 1.1 |
| 165 | La | 1.8 | 107 | 6.2 | 1.1 |
| 166 | La | 2.0 | 118 | 6.9 | 1.5 |
| 167 | Gd | 1.8 | 113 | 6.3 | 1.3 |
| 168 | Gd | 2.0 | 140 | 7.0 | 1.5 |
| 169 | Sc | 2.0 | 102 | 6.7 | 1.0 |
| 170 | Ce | 2.0 | 110 | 6.6 | 1.3 |
| 171 | Pr | 2.0 | 100 | 6.5 | 1.0 |
| 172 | Nd | 2.0 | 108 | 6.4 | 1.2 |
| 173 | Sm | 2.0 | 111 | 6.9 | 1.4 |
| 174 | Eu | 2.0 | 103 | 6.5 | 1.1 |
| 175 | Tb | 2.0 | 104 | 7.0 | 1.1 |
| 176 | Dy | 2.0 | 102 | 6.6 | 1.2 |
| 177 | Ho | 2.0 | 102 | 6.1 | 1.1 |
| 178 | Er | 2.0 | 100 | 6.4 | 1.0 |
| 179 | Yb | 2.0 | 100 | 7.6 | 1.0 |
| 180 | Lu | 2.0 | 102 | 6.3 | 1.0 |

TABLE 10

$(Sr_{0.4}Ba_{0.1}M_{0.1})_{x/0.6}Co_2O_{4-\delta}$

| Ex. | M | X | Seebeck Coefficient 100 K μV/K | Electrical resistivity 100 K mΩcm | ZT 600 K |
|---|---|---|---|---|---|
| 181 | Bi | 1.8 | 120 | 6.5 | 1.3 |
| 182 | Bi | 2.0 | 140 | 7.1 | 1.5 |
| 183 | Y | 1.8 | 108 | 6.3 | 1.0 |
| 184 | Y | 2.0 | 118 | 6.3 | 1.5 |
| 185 | La | 1.8 | 120 | 6.2 | 1.4 |
| 186 | La | 2.0 | 118 | 6.5 | 1.3 |
| 187 | Gd | 1.8 | 115 | 6.3 | 1.3 |
| 188 | Gd | 2.0 | 140 | 7.0 | 1.5 |
| 189 | Sc | 2.0 | 123 | 6.8 | 1.2 |
| 190 | Ce | 2.0 | 108 | 6.5 | 1.0 |
| 191 | Pr | 2.0 | 111 | 6.5 | 1.2 |
| 192 | Nd | 2.0 | 110 | 6.8 | 1.2 |
| 193 | Sm | 2.0 | 111 | 6.9 | 1.4 |
| 194 | Eu | 2.0 | 120 | 6.8 | 1.3 |
| 195 | Tb | 2.0 | 115 | 6.4 | 1.4 |
| 196 | Dy | 2.0 | 121 | 6.7 | 1.5 |
| 197 | Ho | 2.0 | 114 | 6.2 | 1.3 |
| 198 | Er | 2.0 | 130 | 6.9 | 1.3 |
| 199 | Yb | 2.0 | 109 | 6.0 | 1.2 |
| 120 | Lu | 2.0 | 116 | 6.5 | 1.1 |

TABLE 11

$(Ba_{0.4}Ca_{0.1}M_{0.1})_{x/0.6}Co_2O_{4-\delta}$

| Ex. | M | X | Seebeck Coefficient 100K μV/K | Electrical resistivity 100K mΩcm | ZT 600K |
|---|---|---|---|---|---|
| 201 | Bi | 1.8 | 110 | 5.8 | 1.2 |
| 202 | Bi | 2.0 | 132 | 6.4 | 1.5 |
| 203 | Y | 1.8 | 110 | 6.5 | 1.1 |
| 204 | Y | 2.0 | 118 | 6.8 | 1.4 |
| 205 | La | 1.8 | 117 | 6.2 | 1.2 |
| 206 | La | 2.0 | 118 | 6.4 | 1.3 |
| 207 | Gd | 1.8 | 122 | 6.7 | 1.4 |
| 208 | Gd | 2.0 | 131 | 6.8 | 1.6 |
| 209 | Sc | 2.0 | 102 | 6.8 | 1.0 |
| 210 | Ce | 2.0 | 108 | 6.4 | 1.2 |
| 211 | Pr | 2.0 | 112 | 7.0 | 1.1 |
| 212 | Nd | 2.0 | 110 | 6.8 | 1.2 |
| 213 | Sm | 2.0 | 100 | 6.3 | 1.1 |
| 214 | Eu | 2.0 | 118 | 6.5 | 1.2 |
| 215 | Tb | 2.0 | 104 | 6.2 | 1.0 |
| 216 | Dy | 2.0 | 117 | 6.8 | 1.2 |
| 217 | Ho | 2.0 | 107 | 6.9 | 1.1 |
| 218 | Er | 2.0 | 117 | 6.5 | 1.2 |
| 219 | Yb | 2.0 | 122 | 6.7 | 1.2 |
| 220 | Lu | 2.0 | 108 | 6.3 | 1.0 |

TABLE 12

$(Ba_{0.4}Sr_{0.1}M_{0.1})_{x/0.6}Co_2O_{4-\delta}$

| Ex. | M | X | Seebeck Coefficient 100K μV/K | Electrical resistivity 100K mΩcm | ZT 600K |
|---|---|---|---|---|---|
| 221 | Bi | 1.8 | 116 | 5.8 | 1.4 |
| 222 | Bi | 2.0 | 135 | 6.3 | 1.6 |
| 223 | Y | 1.8 | 103 | 5.8 | 1.0 |
| 224 | Y | 2.0 | 120 | 6.1 | 1.2 |
| 225 | La | 1.8 | 111 | 6.2 | 1.2 |
| 226 | La | 2.0 | 126 | 6.7 | 1.5 |
| 227 | Gd | 1.8 | 117 | 6.5 | 1.3 |
| 228 | Gd | 2.0 | 146 | 7.1 | 1.5 |
| 229 | Sc | 2.0 | 103 | 6.5 | 1.0 |
| 230 | Ce | 2.0 | 104 | 6.6 | 1.1 |
| 231 | Pr | 2.0 | 106 | 6.5 | 1.1 |
| 232 | Nd | 2.0 | 118 | 6.3 | 1.5 |
| 233 | Sm | 2.0 | 116 | 6.6 | 1.4 |
| 234 | Eu | 2.0 | 127 | 6.5 | 1.4 |
| 235 | Tb | 2.0 | 100 | 6.7 | 1.0 |
| 236 | Dy | 2.0 | 112 | 6.3 | 1.3 |
| 237 | Ho | 2.0 | 103 | 6.9 | 1.0 |
| 238 | Er | 2.0 | 117 | 6.4 | 1.1 |
| 239 | Yb | 2.0 | 100 | 7.3 | 1.0 |
| 240 | Lu | 2.0 | 102 | 6.3 | 1.0 |

What is claimed is:

1. A thermoelectric module for converting thermal energy to electrical energy comprising:

a P-type thermoelectric material prepared from a complex oxide having the formula: $(A_{0.4}B_{0.1}M_{0.1})_{x/0.6}Co_2O_y$ wherein A and B are elements differing from each other, A and B represent Ca, Sr or Ba, M represents Bi, Sc, Y, La, Ce, Pr, Nd, Sm, Eu, Gd, Tb, Dy, Ho, Er, Yb or Lu, $1.7 \leq x \leq 2$, and $3.8 \leq y \leq 5$;

wherein the complex oxide has a Seebeck coefficient of 100 $\mu$V/K or more at a temperature of 100 K (absolute temperature) or higher, and wherein the complex oxide has an electrical resistivity of 10 m$\Omega$cm or less at a temperature of 100 K (absolute temperature) or higher;

a N-type thermoelectric material;

at least one electrode joining said P-type thermoelectric material to said N-type thermoelectric material; and a wire connected to said P-type thermoelectric material; and a wire connected to said N-type thermoelectric material.

2. The thermoelectric module according to claim 1, wherein A, B, and M are selected from the group consisting of (1) A=Ca, B=Sr and M=Bi, (2) A=Ca, B=Sr and M=Gd, (3) A=Ba, B=Sr and M=Bi, and (4) A=Ba, B=Sr and M=Gd.

3. The thermoelectric module according to claim 1, wherein the thermoelectric figure of merit is 1 or more at 600 K (absolute temperature) or higher.

4. A thermoelectric module for converting thermal energy to electrical energy comprising:

a P-type thermoelectric material prepared from a complex oxide having the formula: $(A_{0.4}B_{0.1}M_{0.1})_{x/0.6}Co_2O_y$ wherein A and B are elements differing from each other, A and B represent Ca, Sr or Ba, M represents Bi, Sc, Y, La, Ce, Pr, Nd, Sm, Eu, Gd, Tb, Dy, Ho, Er, Yb or Lu, $1.7 \leq x \leq 2$, and $3.8 \leq y \leq 5$;

a N-type thermoelectric material;

at least one electrode joining said P-type thermoelectric material to said N-type thermoelectric material; and a wire connected to said P-type thermoelectric material; and a wire connected to said N-type thermoelectric material.

5. The thermoelectric module according to claim 4, wherein the complex oxide has a Seebeck coefficient of 100 $\mu$V/K or more at a temperature of 100 K (absolute temperature) or higher.

6. The thermoelectric module according to claim 4, wherein the complex oxide has an electrical resistivity of 10 m$\Omega$cm or less at a temperature of 100 K (absolute temperature) or higher.

7. The thermoelectric module according to claim 4, wherein A, B, and M are selected from the group consisting of (1) A=Ca, B=Sr and M=Bi, (2) A=Ca, B=Sr and M=Gd, (3) A=Ba, B=Sr and M=Bi, and (4) A=Ba, B=Sr and M=Gd.

* * * * *

UNITED STATES PATENT AND TRADEMARK OFFICE
CERTIFICATE OF CORRECTION

PATENT NO. : 6,727,424 B2
DATED : April 27, 2004
INVENTOR(S) : Ryoji Funahashi et al.

It is certified that error appears in the above-identified patent and that said Letters Patent is hereby corrected as shown below:

Title page,
Item [73], Assignee, add -- Secretary, -- before "Agency of Industrial Science and Technology"

Signed and Sealed this

Seventh Day of June, 2005

JON W. DUDAS
*Director of the United States Patent and Trademark Office*